United States Patent [19]

Wang

[11] Patent Number: 5,051,691

[45] Date of Patent: Sep. 24, 1991

[54] ZERO POWER DISSIPATION LASER FUSE SIGNATURE CIRCUIT FOR REDUNDANCY IN VLSI DESIGN

[75] Inventor: Chen Y. Wang, San Jose, Calif.

[73] Assignee: Samsung Semiconductor, Inc., San Jose, Calif.

[21] Appl. No.: 582,455

[22] Filed: Sep. 13, 1990

[51] Int. Cl.[5] ...................... G01R 31/02; G06F 11/00
[52] U.S. Cl. ................................. 324/158 R; 324/73.1;
324/550; 371/21.1
[58] Field of Search .................. 324/73.1, 158 R, 550;
357/40; 307/303.1; 371/21.1, 15, 21.2; 437/8

[56] References Cited

U.S. PATENT DOCUMENTS 4,698,589 10/1987 Blankenship et al. ........... 324/158 R
4,701,695 10/1987 Chan et al. ........................ 324/550
4,837,520 6/1989 Golke et al. ....................... 324/550

Primary Examiner—Kenneth Wieder
Assistant Examiner—Vinh P. Nguyen
Attorney, Agent, or Firm—Townsend and Townsend

[57] ABSTRACT

A laser fuse signature circuit for testing whether a fuse link in an IC has been disconnected includes a first series circuit connecting the power and ground pins and a second series circuit, including the fuse and a plurality of diode devices, connecting an input pin to a first node in the first series circuit. Transistors included in the first series circuit are connected so that the laser fuse signature circuit does not conduct current during normal operation or leakage current testing of the IC.

3 Claims, 1 Drawing Sheet

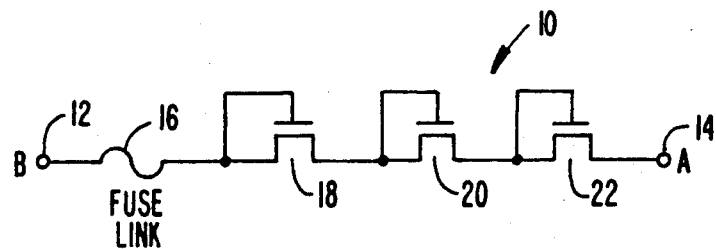
*FIG._1.* PRIOR ART
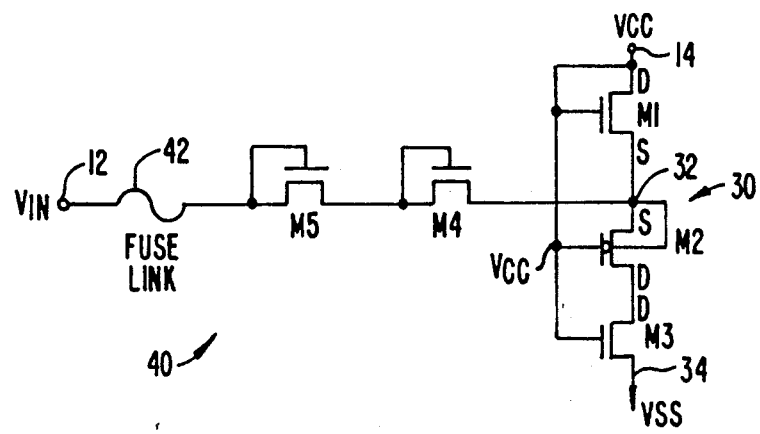
*FIG._2.*
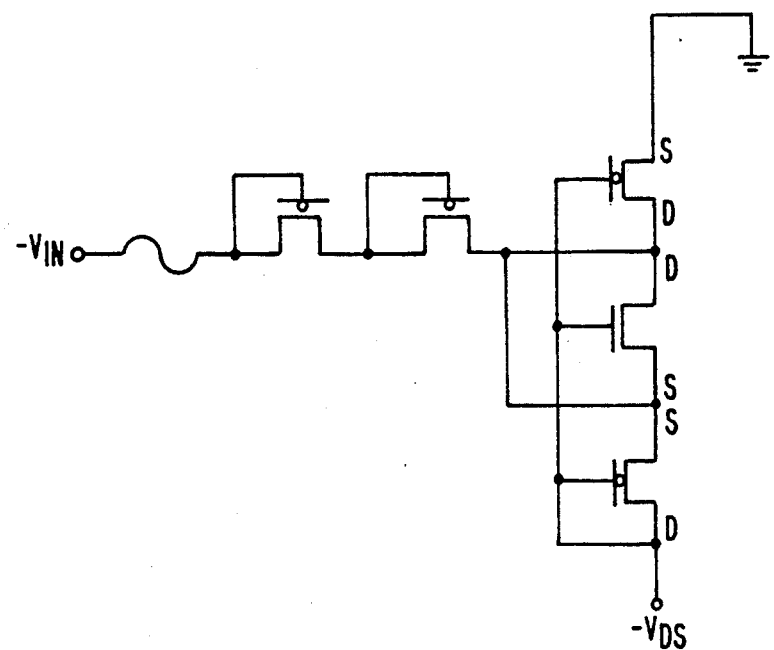
*FIG._3.*

ZERO POWER DISSIPATION LASER FUSE SIGNATURE CIRCUIT FOR REDUNDANCY IN VLSI DESIGN

BACKGROUND OF THE INVENTION

1. Field of the Invention

The present invention relates generally to integrated circuits having on-chip redundant circuits and more particularly relates to a circuit for testing whether an integrated circuit has been modified to use a redundant circuit.

2. Description of the Relevant Art

It is well-known to include redundant circuits on an integrated circuit (IC) to increase the yield of the manufacturing process. For example, in memory multiple redundant rows and columns are often included to replace rows and columns that may be inoperative due to manufacturing defects. In many ICs a fuse link connects the input pin to the internal circuitry of the IC.

The IC is tested for detects during the manufacturing process. If the defect can be corrected by substituting an onboard redundant circuit for an inoperative circuit then the fuse link is disconnected, for example, by laser zapping, to substitute a functional redundant circuit for the defective main circuit. The manufacturing process is then completed and the chip is packaged and sold to customers. There is no indication on the final packaged ICs indicating whether redundant circuits have been activated.

In many instances, in particular where the design and process technology for a particular IC are not in a mature stage, manufacturers and end users may need to differentiate prime virgin devices from repaired devices because of differences in reliability and performance degradation. Accordingly, a fuse signature feature is incorporated in many ICs.

One example of a typical fuse signature circuit is depicted in FIG. 1. Typically, an IC includes power and ground pins connected to a power supply and a number of I/O pins for receiving and transmitting signals during normal operation. The allowable voltage levels for signals received on these pins are specified by the manufacturer. Referring now to FIG. 1, the fuse signature circuit 10 serially connects an input pin 12 to a power pin 14. The circuit includes a fuse 16 and three diode connected NMOS transistors 18, 20, and 22 coupled in series.

The state of the fusible link is tested by applying a test signal, having a test voltage level greater than $3*V_{TN}$, where $V_{TN}$ is the threshold voltage of the NMOS transistors 18, 20, and 22, to the input pin 12 and tying the power pin 14 to ground. If the fuse link is disconnected then no current flows through the input pin 12 and if the fuse link is connected then current does flow through the input pin.

This type of fuse signature circuit creates a problem when the IC is tested for short circuits or leakage current. During this test, the input pin is connected to a voltage terminal and all other pins are connected to ground. Unfortunately, the fuse signature circuit of FIG. 1 will allow current to flow through input pin 1 regardless of whether short circuits or leakage current are present in the IC. Accordingly, the short circuit test is difficult to perform when the above-described fuse signature circuit is included on the IC.

SUMMARY OF THE INVENTION

The present invention is an improved fuse signature circuit that provides for fuse signature testing and unambiguous short circuit and leakage current testing of an IC.

The fuse signature circuit includes a first series circuit formed of at least three transistors coupling the power and ground pins. A second series circuit of diodes or diode coupled transistors couples the input pin to a first node in he first series circuit.

The diodes or diode connected transistors in the second series circuit cause a voltage drop between the input pin and the first node and allow current to flow only in one direction, i.e., from the input pin to the first node. In the first series circuit, the first and third transistors are of a first conductivity type, the second transistor is of a second conductivity type, and the control terminals of all the transistors are coupled to the power pin.

During normal operation, the operating voltage level on the power pin is insufficient to bias the first node to a high enough voltage to turn on the second transistor. Thus, no current can flow from the input pin through the fuse signature circuit and the fuse signature circuit has no effect. During a test for short circuits and leakage current, the first and second transistors are off because the power pin is grounded and no current flows through the fuse signature circuit.

During fuse signature testing, a test voltage of sufficient magnitude to bias the first node to turn on the second transistor is applied to the input pin and the power pin is biased to the supply voltage. The third transistor is on because the control terminal is coupled to the power pin. If the fuse is connected then current flows through the second series circuit, the second transistor, the third transistor to indicate that the IC has not been repaired. Of course, if the fuse is disconnected then no current flows.

Other features and advantages of the invention will be apparent in view of the drawings and following detailed description.

BRIEF DESCRIPTION OF THE DRAWINGS

FIG. 1 is a circuit diagram of a standard fuse signature circuit;

FIG. 2 is a circuit diagram of a preferred embodiment of the fuse circuit of the present invention; and FIG. 3 is a circuit diagram of an alternative embodiment of the invention.

DETAILED DESCRIPTION OF THE PREFERRED EMBODIMENTS

FIG. 2 is a circuit diagram of preferred embodiment of the invention. Identical or corresponding parts in the different figures are given the same reference numbers.

Referring now to FIG. 2, a first series circuit 30 includes NMOS transistors M1 and M3 and a PMOS transistor M2. The first terminal of M1 is coupled to the power pin 14 and the second terminal is coupled to a first node 32. The first terminal of M2 is coupled to the first node 32 and the second terminal is coupled to first terminal of M3. The second terminal of M3 is coupled to the ground pin 34. In the depicted configuration, the sources of M1 and M2 are coupled to the first node 32 and the source of M3 is coupled to the ground pin 34.

A second series circuit 40, comprising the fuse 42 and diode connected NMOS transistors M4 and M5, couples the input pin 12 to the first node 32.

The operation of the fuse signature circuit depicted in FIG. 2 will now be described. As is well-known, an NMOS transistor will conduct only when the gate voltage (VG) exceed the source voltage (VS) by the threshold voltage (VTN) That is:

$$V_G - V_S > V_{TN} \qquad \text{EQ. 1}$$

Similarly, a PMOS transistor will conduct only when:

$$V_G - V_S < V_{TP} \qquad \text{EQ. 2}$$

Additionally, the voltage drop across an NMOS transistor is equal to $V_{TN}$ and the voltage drop across a PMOS transistor is equal to $V_{TP}$.

Turning first to the operation of the circuit when testing the fuse signature of an IC, the magnitude $V_G(M2)$ is the power supply voltage level $V_{CC}$. Accordingly, from EQ. 1, if $V_S$ is greater than $V_{CC} + V_{TP}$ then M2 will conduct. Since the voltage drop in the second series circuit is $2V_{TN}$, the first node 32 will be charged to $V_{CC} + V_{TP}$ if the magnitude of voltage of the test signal is greater than $2V_{TN} + V_{CC} + V_{TP}$ and the fuse is connected. Thus, M2 will conduct and, from EQ. 1, M3 will conduct and current will flow through the input pin 12 to indicate that the fuse is connected. If the fuse is disconnected the second series circuit 40 will be an open circuit and no current will flow through the input pin 12.

Turning next to the short circuit and leakage current test, if the power and ground pins 14 and 34 are grounded than $V_G$ is equal to 0 volts and, from EQ. 1, neither M1 or M3 will conduct and no current will flow through the fuse signature circuit 30. Accordingly, any current flowing through the input pin during this test will unambiguously indicate the presence of leakage current in the IC.

Turning finally to normal operation, typically the power pin will be at $V_{CC}$ (5.0 volts), the ground pin at 0 volts, and the maximum operating voltage of the input signals at about 1 volt over $V_{CC}$. Accordingly, the first node 32 will be precharged to about $V_{CC} - V_{TN}$ which is the magnitude of $V_S(M2)$. Since $V_G(M2)$ is equal to $V_{CC}$, $V_G(M2)$ is greater than $V_S(M2)$. However, from EQ. 2, M2 can not conduct unless $V_G(M2)$ is less than $V_S(M2)$. Accordingly, no current flows through the fuse signature circuit 30 during normal operating conditions. Note also that the normal voltage level of the signals on the input are not sufficient to charge the first node 32 high enough to turn on M2 because of the voltage drop due to M4 and M5.

The invention has now been described with reference to a preferred embodiment. Alternatives and substitutions will now be obvious to persons of ordinary skill in the art. For example, the principles of the invention are applicable to bipolar circuits and MOS circuits utilizing different combinations of N and M MOS transistors. An example of a circuit utilizing an NMOS transistor as the second transistor is depicted in FIG. 3. Further, the voltage drops achieved by M5 and M4 may also be achieved by substituting diodes for those transistors. Additionally, different numbers of transistors can be utilized and additional circuit elements added without changing the operation of the invention. Accordingly, it is not intended to limit the invention except as provided by the appended claims.

What is claimed is:

1. In an integrated circuit having input, power, and ground pins, where signals having an operating voltage level are applied to the input pin during normal operating conditions, a fuse signature circuit for testing whether a fuse-link connecting a selected input pin to other circuitry on the integrated circuit is connected or disconnected, where a test signal having a test voltage level greater than the operating voltage level is applied to the selected input pin during fuse signature testing, said circuit for fuse signature testing comprising:
  a first transistor, of a first conductivity type, having first, second, and control terminals, with its first and control terminals coupled to the power pin and its second terminal coupled to a first node;
  a second transistor, of a second conductivity type, having first, second, and control terminals, with its first terminal coupled to said first node and its control terminal coupled to the power pin;
  a third transistor, of the first conductivity type, having a first terminal coupled to the second terminal of said second transistor, its control terminal coupled to the power pin, and its second terminal coupled to the ground pin, where said first, second, and third transistors serially connect power and ground pins;
  a series diode circuit, comprising at least one diode connected transistor of the first conductivity type, said series diode circuit serially connecting the fuse to said first node to reduce the voltage level applied to the input pin by the sum of the threshold voltages of said diode connected transistors included in said series diode circuit and with the magnitude of said sum sufficient to prevent said second transistor from turning on when a signal having the operating voltage level is applied to the input pin during normal operation and where said first and third transistors are turned off so that no current flows through said circuit for testing when the power and ground pins are grounded and a voltage signal is applied to the input pin to test the integrated circuit for a short circuit or leakage current.

2. The fuse signature circuit of claim 1 wherein:
said first and third transistors are NMOS transistors and said second transistor is a PMOS transistor and said power pin is biased to a positive power supply voltage.

3. The fuse signature circuit of claim 1 wherein:
said first and third transistors are PMOS transistors and said second transistor is an NMOS transistor and said power pin is biased to a negative power supply voltage.

* * * * *